US008154328B1

(12) United States Patent
Vemula

(10) Patent No.: US 8,154,328 B1
(45) Date of Patent: Apr. 10, 2012

(54) TECHNIQUES FOR MEASURING PHASES OF PERIODIC SIGNALS

(75) Inventor: Sudheer Vemula, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 12 days.

(21) Appl. No.: 12/814,332

(22) Filed: Jun. 11, 2010

(51) Int. Cl.
*H03L 7/06* (2006.01)
(52) U.S. Cl. ......................... 327/158; 327/149
(58) Field of Classification Search .............. 327/149, 327/158
See application file for complete search history.

(56) References Cited

U.S. PATENT DOCUMENTS

| 6,809,555 | B1 * | 10/2004 | Nguyen ............... 327/3 |
| 2004/0212447 | A1 | 10/2004 | Nystrom et al. |
| 2007/0182492 | A1 * | 8/2007 | Scuteri et al. ............ 331/1 A |
| 2008/0180149 | A1 * | 7/2008 | Byun ..................... 327/158 |
| 2009/0096439 | A1 | 4/2009 | Hsu et al. |
| 2009/0141825 | A1 * | 6/2009 | Jacobsson et al. ........ 375/294 |
| 2011/0204941 | A1 * | 8/2011 | Lee ...................... 327/158 |
| 2011/0234281 | A1 * | 9/2011 | Kim ...................... 327/158 |

* cited by examiner

*Primary Examiner* — Lincoln Donovan
*Assistant Examiner* — Adam Houston
(74) *Attorney, Agent, or Firm* — Steven J. Cahill

(57) ABSTRACT

A phase detector circuit generates a phase comparison signal based on a phase difference between first and second periodic signals during a test mode. Phases of the first and the second periodic signals do not change in response to variations in a signal generated by the phase detector circuit during the test mode. A lock generation circuit generates an output signal based on the phase comparison signal that indicates if the first and the second periodic signals are within a lock window of the lock generation circuit. The lock window of the lock generation circuit changes in response to a variation in a control signal.

21 Claims, 12 Drawing Sheets

TECHNIQUES FOR MEASURING PHASES OF PERIODIC SIGNALS

BACKGROUND

The present invention relates to electronic circuits, and more particularly, to circuits and methods for measuring phases of periodic signals.

Interfaces that transfer data at high speeds use high frequency clock signals that are generated by circuitry such as a phase-locked loop (PLL). Accuracy between the phases of the output clock signals generated by the PLL is required to ensure that a high speed interface functions properly. Even a small misalignment in the phase of a PLL output clock signal may cause the high speed interface to malfunction.

Analog measurements can be performed to measure the phase difference between two clock signals. The input clock signals are transmitted as inputs to a phase frequency detector (PFD) that generates an output voltage having an analog DC (direct current) value that is based on the phase difference between the two input clock signals. Measuring the DC value of the output voltage of the PFD is an analog measurement. In order to measure the output voltage of the PFD, the output voltage of the PFD is transmitted to a test pin. If the PFD is not built into the device, then the two clock signals that are to be measured are transmitted to test pins and then the phase difference is measured using a tester.

One problem with making an analog measurement of the DC value of the output voltage of a PFD is that the time required to make such a measurement is long. Analog signals require a very long time for making measurements compared to digital signals. Also, parametric measurement units may have to be installed on the tester, which are expensive. In order for the tester to have access to the signals to be tested, the signals have to be routed to test pins and from the test pins to bumps on the printed circuit board (PCB) to make the measurements. Routing high speed signals to test pins is difficult and expensive.

BRIEF SUMMARY

According to some embodiments, a phase detector circuit generates a phase comparison signal based on a phase difference between first and second periodic signals during a test mode. Phases of the first and the second periodic signals do not change in response to variations in a signal generated by the phase detector circuit during the test mode. A lock generation circuit generates an output signal based on the phase comparison signal that indicates if the first and the second periodic signals are within a lock window of the lock generation circuit. The lock window of the lock generation circuit changes in response to a variation in a control signal.

According to other embodiments, a delay-locked loop circuit generates a delay control signal. A delay circuit delays a first periodic signal to generate a second periodic signal. A delay that the delay circuit provides to the first periodic signal is based on the delay control signal. A phase detector circuit generates a phase comparison signal based on a phase difference between the second periodic signal and a third periodic signal. A lock generation circuit generates an output signal based on the phase comparison signal that indicates if the second and the third periodic signals are within a margin of error determined by the lock generation circuit.

Various objects, features, and advantages of the present invention will become apparent upon consideration of the following detailed description and the accompanying drawings.

DETAILED DESCRIPTION

According to some embodiments, test circuitry such as phase shift circuitry, a phase frequency detector, and a lock generation circuit test the phase difference between first and second periodic signals. The first and second periodic signals can, for example, be generated by a phase-locked loop. As another example, the first and second periodic signals can be output by a delay-locked loop. The first periodic signal is phase shifted by the phase shift circuitry to generate a phase shifted periodic signal. The phase shifted periodic signal and the second periodic signal are transmitted to inputs of the phase frequency detector. One or more output signals of the phase frequency detector are transmitted to the lock generation circuit. The lock generation circuit generates an output signal that indicates if the phase difference between the phase shifted periodic signal and the second periodic signal is within the lock window of the lock generation circuit. The lock window of the lock generation circuit can be adjusted to provide a desired accuracy.

Figure 1A:
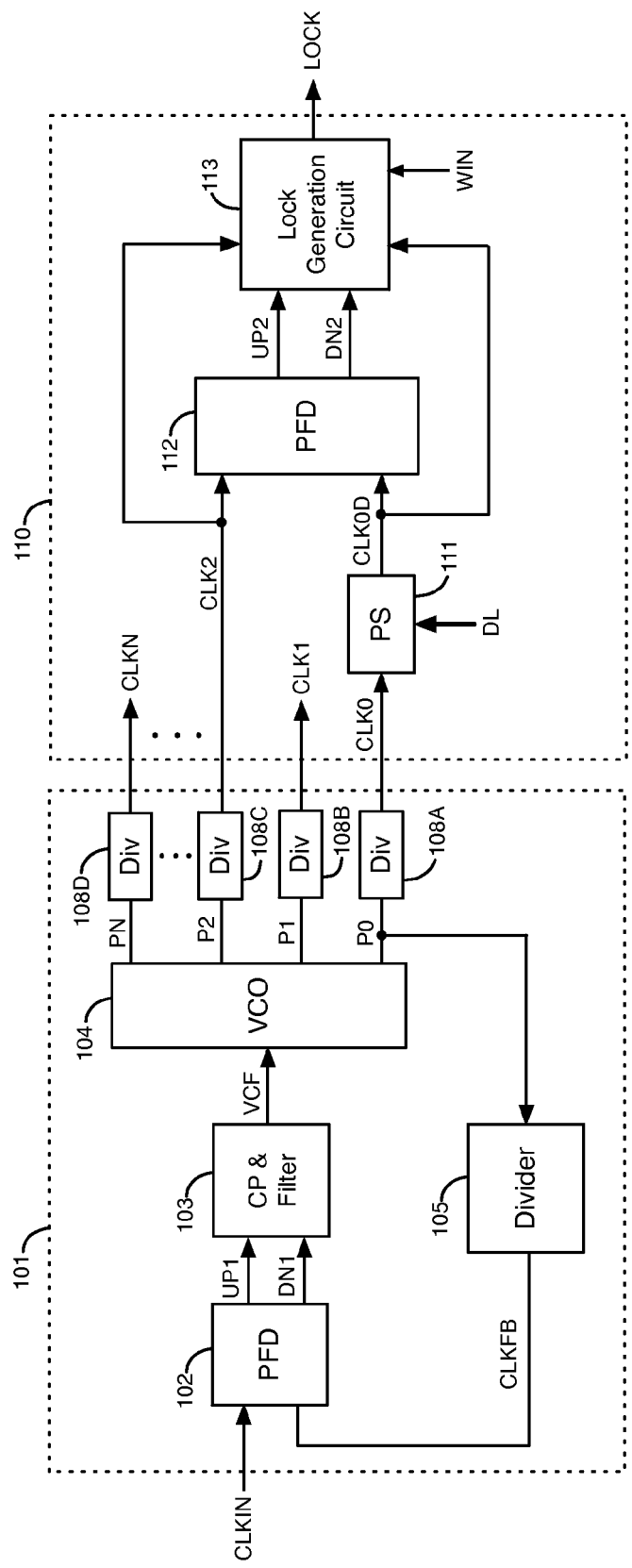
FIG. 1A illustrates test circuitry for testing a phase difference between two periodic signals generated by a phase-locked loop (PLL) circuit, according to an embodiment of the present invention.

FIG. 1A illustrates test circuitry 110 for testing a phase difference between two periodic signals generated by a phase-locked loop (PLL) circuit 101, according to an embodiment of the present invention. Test circuitry 110 tests the phase difference between two output clock signals CLK0 and CLK2 of PLL 101. According to other embodiments, test circuitry 110 can test the phase difference between two output periodic signals of a delay-locked loop circuit or another type of periodic signal generation circuit.

PLL 101 includes a phase frequency detector circuit 102, charge pump and loop filter circuitry 103, voltage-controlled oscillator (VCO) circuit 104, and frequency divider circuits 105 and 108A-108D. VCO 104 generates an N+1 number of periodic output clock signals including clock signals P0, P1, P2, and PN. Clock signal P0 is transmitted to an input of frequency divider 105. Frequency divider 105 generates a periodic feedback clock signal CLKFB in response to clock signal P0. Frequency divider 105 causes the frequency of CLKFB to be a fraction of the frequency of clock signal P0.

Phase frequency detector (PFD) 102 compares the phase and the frequency of a periodic input clock signal CLKIN to the phase and the frequency of a feedback clock signal CLKFB to generate pulses in UP1 and DN1 output signals. The UP1 and DN1 signals are transmitted to inputs of a charge pump (CP) in circuit 103. The charge pump (CP) in circuit 103 controls its output control voltage in response to the UP1 and DN1 signals. The output voltage of the charge pump is low pass filtered by a loop filter in circuit 103 to generate filtered output voltage VCF. The charge pump CP sends charge to the loop filter in response to logic high pulses in the UP1 signal. The charge pump drains charge from the loop filter in response to logic high pulses in the DN1 signal.

The filtered output voltage VCF of circuit 103 is transmitted to a control input of voltage-controlled oscillator (VCO) circuit 104. VCO 104 varies the frequency of its periodic output clock signals P0, P1, P2, PN, etc. in response to changes in the output voltage VCF of circuit 103.

PFD 102 generates longer logic high pulses in the UP1 signal than in the DN1 signal if the phase of clock signal CLKIN is leading feedback clock signal CLKFB. When logic high pulses in the UP1 signal are longer than logic high pulses in the DN1 signal, circuit 103 increases control voltage VCF, causing the frequency of the output clock signals of VCO 104 to increase, which causes the frequency of the CLKFB signal to increase.

PFD 102 generates longer logic high pulses in the DN1 signal than in the UP1 signal if the phase of feedback clock signal CLKFB is leading clock signal CLKIN. When logic high pulses in the DN1 signal are longer than logic high pulses in the UP1 signal, circuit 103 decreases control voltage VCF, causing the frequency of the output clock signals of VCO 104 to decrease, which causes the frequency of the CLKFB signal to decrease.

Each of the output clock signals generated by VCO 104 has the same frequency. VCO 104 varies the frequency of its output clock signals in response to changes in the control voltage VCF, until clock signal CLKIN and the feedback clock signal CLKFB are frequency and phase aligned. PLL 101 is in lock mode when clock signal CLKIN and feedback clock signal CLKFB have the same frequency and phase.

Frequency divider circuits 108A, 108B, 108C, and 108D generate frequency divided clock signals CLK0, CLK1, CLK2, and CLKN in response to clock signals P0, P1, P2, and PN, respectively. Frequency divider circuits 108A, 108B, 108C, and 108D divide the frequencies of clock signals P0, P1, P2, and PN by frequency division values to generate the frequencies of frequency divided clock signals CLK0, CLK1, CLK2, and CLKN, respectively. Frequency divider circuits 108A, 108B, 108C, and 108D are programmable. Thus, the frequency division values of frequency divider circuits 108A, 108B, 108C, and 108D can be programmed to different frequency division values. Frequency divider circuits 108A, 108B, 108C, and 108D are optional in a PLL that is tested by test circuitry 110. Test circuitry 110 can be used to test PLLs that do not have output frequency divider circuits.

Test circuitry 110 includes a phase shift circuit 111, phase frequency detector (PFD) circuit 112, and lock generation circuit 113. Test circuitry 110 may be on the same integrated circuit die as PLL 101 or on a different integrated circuit die than PLL 101. Test circuitry 110 may be dedicated test circuitry that is only used for testing the phases of clock signals such as the output clock signals of PLL 101. Alternatively, test circuitry 110 may be used for other purposes in addition to testing the phases of clock signals. For example, PFD 112 and lock generation circuit 113 may be part of a second PLL. PFD 112 can be any type of PFD having any suitable architecture.

Clock signal CLK2 generated by frequency divider circuit 108C is transmitted to a first input of PFD 112. Clock signal CLK0 generated by frequency divider circuit 108A is transmitted to an input of phase shift circuit 111. Phase shift circuit 111 phase shifts CLK0 to generate a phase shifted clock signal CLK0D.

The phase shift that circuit 111 provides to CLK0D relative to CLK0 is selected to equal a target phase offset (i.e., a desired phase offset) between clock signals CLK0 and CLK2. For example, if a target phase offset between clock signals CLK0 and CLK2 is selected to be 90°, then phase shift circuit 111 causes CLK0D to be delayed by 90° relative to CLK0, where 90° refers to one-quarter of the period of CLK0. Phase shift circuit 111 can provide any target phase shift to CLK0D relative to CLK0, such as 45°, 60°, 90°, 120°, 135°, 180°, 200°, 270°, 315°, etc.

Phase shift circuit 111 is an adjustable phase shift circuit. The phase shift provided by circuit 111 can be adjusted to equal any desired target phase offset between two output clock signals of PLL 101 that are tested by circuitry 110. The phase shift that circuit 111 provides to CLK0D relative to CLK0 is programmed based on the logic states of a set of programmable delay (DL) signals.

Test circuitry 110 determines if the phase difference between clock signals CLK0 and CLK2 equals the target phase offset within a phase margin of error referred to as the lock window. Clock signal CLK0D is transmitted to a second input of PFD 112. Although CLK0 and CLK2 are tested by circuitry 110 in the example of FIG. 1A, test circuitry 110 can test any two output clock signals of PLL 101.

If clock signals CLK0 and CLK2 are offset in phase by the target phase offset, then clock signals CLK0D and CLK2 are aligned in phase. However, clock signals CLK0 and CLK2 may have a phase offset that is larger than or smaller than the target phase offset (e.g., as a result of process variations in the integrated circuit or defects during fabrication). If CLK0 and CLK2 have a phase offset that is larger than or smaller than the target phase offset, then clock signals CLK0D and CLK2 are not aligned in phase.

PFD 112 compares the phase and frequency of clock signal CLK0D to the phase and frequency of clock signal CLK2 to generate output signals UP2 and DN2. If the phase of clock signal CLK2 is leading clock signal CLK0D, PFD 112 generates longer logic high pulses in the UP2 signal than in the DN2 signal. If the phase of clock signal CLK0D is leading clock signal CLK2, PFD 112 generates longer logic high pulses in the DN2 signal than in the UP2 signal. If the phases of CLK0D and CLK2 are aligned, PFD 112 generates logic high pulses in the UP2 signal that have the same durations as the logic high pulses that PFD 112 generates in the DN2 signal.

The UP2 and DN2 signals generated by PFD 112 are transmitted to inputs of lock generation circuit 113. Lock generation circuit 113 generates a digital output LOCK signal in response to the UP2 and DN2 input signals. The test circuitry 110 of FIG. 1A measures the phase alignment between two periodic signals to generate a digital LOCK signal that is output by lock generation circuit 113. Thus, test circuitry 110 eliminates the difficulty of routing analog signals and making analog measurements.

Lock generation circuit 113 generates a logic high state in the LOCK signal if the durations of the logic high pulses in the UP2 signal are the same as the durations of the logic high pulses in the DN2 signal, indicating that the phases of CLK0D and CLK2 are aligned. Lock generation circuit 113 also generates a logic high state in the LOCK signal if the differences between the durations of the logic high pulses in the UP2 signal and the durations of the logic high pulses in the DN2 signal are within a margin of error referred to as the lock window. Lock generation circuit 113 generates a logic low state in the LOCK signal if the differences between the durations of the logic high pulses in the UP2 signal and the durations of the logic high pulses in the DN2 signal are outside of the lock window margin of error. The LOCK signal may, for example, be transmitted to an external pin of the integrated circuit so that it can be monitored by external circuitry.

The lock window of lock generation circuit 113 is determined by the WIN input signal. The lock window of lock generation circuit 113 can be adjusted to provide a desired precision to the test of the phase difference between CLK0 and CLK2 that is performed by test circuitry 110. The lock window of circuit 113 can be varied by changing the logic state of the WIN signal. The logic state of the LOCK signal indicates whether the phases of CLK0D and CLK2 fall within or outside the programmed lock window of circuit 113.

For example, lock generation circuit 113 may be programmed by the WIN signal to have a lock window that corresponds to +/−3% of the periods of CLK0 and CLK2. In this example, if the phase offset between the CLK0D and CLK2 signals is equal to or less than +/−3% of the periods of CLK0D and CLK2, then circuit 113 generates a logic high state in the LOCK signal. If the phase offset between the CLK0D and CLK2 signals is greater than +/−3% of the periods of CLK0D and CLK2, then circuit 113 generates a logic low state in the LOCK signal.

The test circuitry of FIG. 1A can identify phase error offsets in either one of the input clock signals CLK0 and CLK2. However, if clock signals CLK0 and CLK2 both have equal phase error offsets, then lock generation circuit 113 will drive the LOCK signal to a logic high state, because the test circuitry of FIG. 1A only measures the phase difference between CLK0 and CLK2.

Figure 1B:
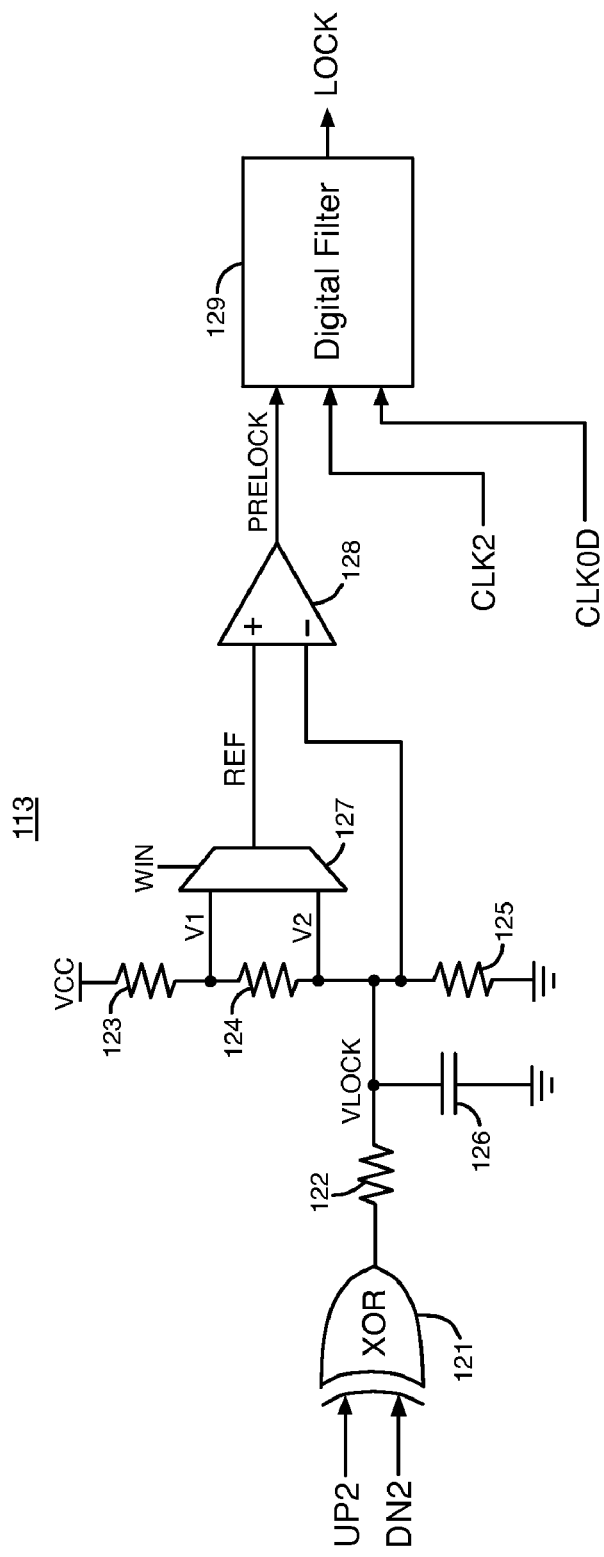
FIG. 1B illustrates an example of the lock generation circuit in the test circuitry shown in FIG. 1A, according to an embodiment of the present invention.

FIG. 1B illustrates an example of the lock generation circuit 113 in test circuitry 110, according to an embodiment of the present invention. Lock generation circuit 113 can have any suitable circuit architecture. One type of architecture for lock generation circuit 113 is shown in FIG. 1B merely as an example this is not intended to be limiting.

Lock generation circuit 113 includes XOR gate circuit 121, resistors 122-125, capacitor 126, multiplexer circuit 127, comparator circuit 128, and digital filter circuit 129. Resistors 123-125 are coupled together to form a resistor divider between VCC and ground that generates two voltages V1 and V2 at the inputs of multiplexer 127. Multiplexer 127 selects one of the signals V1 or V2 for transmission to the non-inverting input (+) of comparator 128 as the reference signal REF based on the logic state of the WIN signal. The voltage of the reference signal REF determines the lock window of lock generation circuit 113.

The UP2 and DN2 signals generated by PFD 112 are transmitted to inputs of XOR gate 121. When clock signals CLK0D and CLK2 have the same frequency and are aligned in phase, the UP2 and DN2 signals both have periodic positive going pulses that are aligned in phase. As a result, the output signal of XOR gate 121 is in a logic low state, and the voltage VLOCK on capacitor 126 is discharged to 0 volts. The PRELOCK output signal generated at the output of comparator 128 and the LOCK signal generated at the output of digital filter 129 are both in logic high states, indicating a lock condition. Digital filter 129 filters the PRELOCK signal in response to the CLK0D and CLK2 signals to generate the LOCK signal.

When the phase difference between CLK0D and CLK2 is larger than the lock window of circuit 113, the UP2 and DN2 signals have periodic positive going pulses that have significantly different widths. As a result, the output signal of XOR gate 121 is in a logic high state for most of the period of UP2 and DN2, and voltage VLOCK on capacitor 126 is charged up closer to supply voltage VCC. When the VLOCK voltage at the inverting input (−) of comparator 128 exceeds the REF voltage at the non-inverting input of comparator 128, the PRELOCK and LOCK signals transition to logic low states, indicating an out-of-lock condition. According to other embodiments, the lock window of lock generation circuit 113 is variable based on three or more WIN signals that cause a multiplexer to select among 3 or more reference voltage signals that set the threshold of comparator 128.

Figure 2:
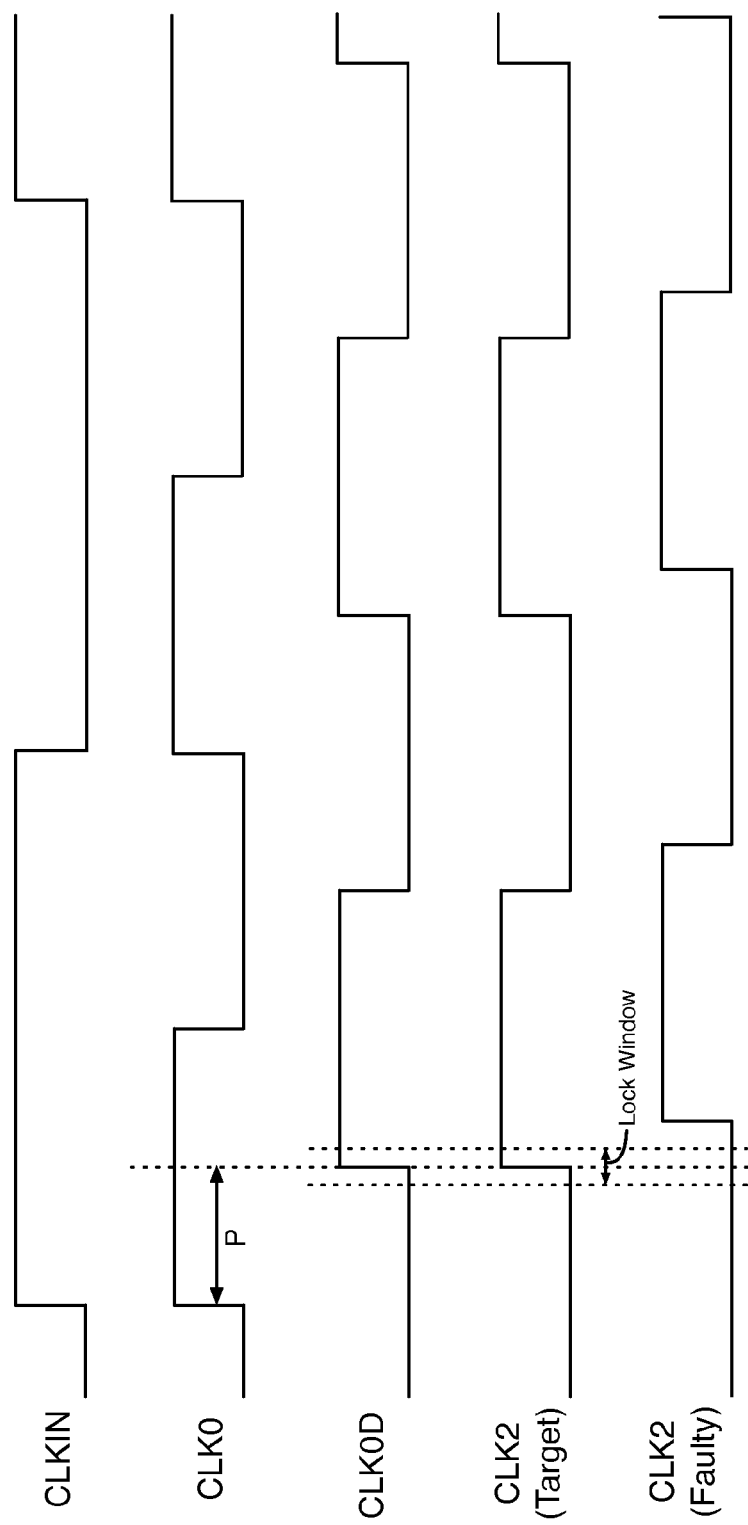
FIG. 2 is a timing diagram that illustrates examples of some of the clock signals shown in FIG. 1A.

FIG. 2 is a timing diagram that illustrates examples of some of the clock signals shown in FIG. 1A. In the example of FIG. 2, clock signals CLK0 and CLK2 each have a frequency that is twice the frequency of input clock signal CLKIN. The target phase offset between clock signals CLK0 and CLK2 is 90° in this example. The phase shift P of phase shift circuit 111 is set to equal 90°, as shown in FIG. 2. As a result, the phase of clock CLK0D is delayed by 90° relative to the phase of clock signal CLK0.

If clock signal CLK2 has the target phase offset of 90° relative to the phase of CLK0, then clock signals CLK2 and CLK0D are aligned in phase, and lock generation circuit 113 generates a logic high state in the LOCK signal. If the phase of clock signal CLK2 varies from the target phase offset by an amount that is greater than the amount allowed by the lock window of lock generation circuit 113, then circuit 113 generates a logic low state in the LOCK signal. The waveform labeled as CLK2 (Faulty) in FIG. 2 illustrates an example of a phase of CLK2 that falls outside the lock window.

Figure 3:
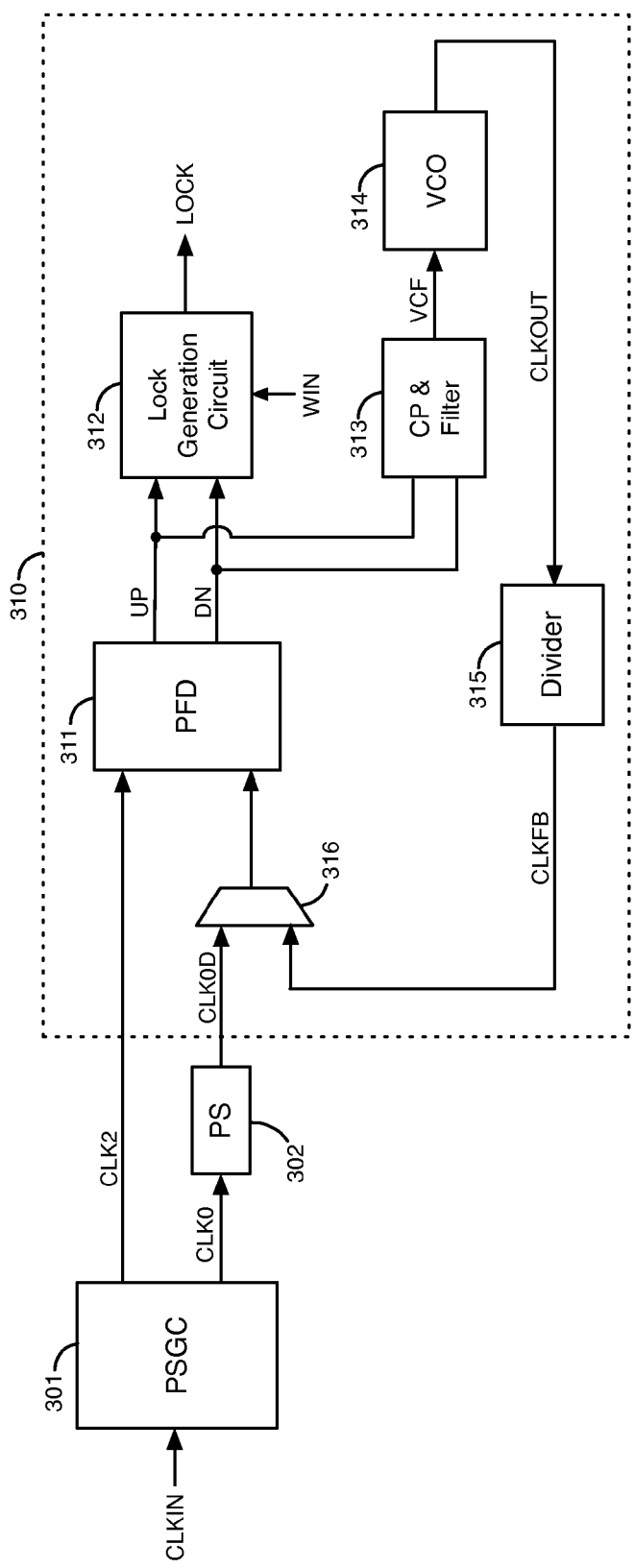
FIG. 3 illustrates another example of test circuitry that tests a phase difference between two periodic signals, according to an embodiment of the present invention.

FIG. 3 illustrates another example of test circuitry that tests a phase difference between two periodic signals, according to an embodiment of the present invention. The test circuitry of FIG. 3 tests two periodic clock signals CLK0 and CLK2 that are generated by periodic signal generation circuit (PSGC) 301. PSGC circuit 301 can be a phase-locked loop such as PLL 101, a delay-locked loop, or another type of circuit that generates periodic signals.

The test circuitry of FIG. 3 includes phase shift circuit 302, multiplexer circuit 316, phase frequency detector (PFD) circuit 311, and lock generation circuit 312. PFD circuit 311, lock generation circuit 312, charge pump and filter circuit 313, voltage-controlled oscillator (VCO) 314, frequency divider circuit 315, and multiplexer circuit 316 are part of phase-locked loop (PLL) circuit 310.

In the embodiment of FIG. 3, one output clock signal CLK2 of circuit 301 is transmitted to a first input of PFD circuit 311 in PLL 310. Another output clock signal CLK0 of circuit 301 is transmitted to an input of phase shift circuit 302. Phase shift circuit 302 has an adjustable phase shift that is set to equal the target phase offset between clock signals CLK0 and CLK2. Phase shift circuit 302 phase shifts CLK0 to generate clock signal CLK0D. Clock signal CLK0D is transmitted to an input of multiplexer 316.

Multiplexer circuit 316 can be configured to transmit either of clock signals CLK0D or CLKFB to the second input of PFD 311. If multiplexer circuit 316 is configured to transmit CLKFB to the second input of PFD 311, then PFD 311, charge pump and filter circuit 313, VCO 314, and divider 315 function as a PLL as described above with respect to PLL 101.

PLL 310 can, for example, be an adjacent PLL on the same integrated circuit as PSGC 301. In this embodiment, PLL 310 is used as a PLL to generate output clock signals during the normal operation (e.g., user mode) of the integrated circuit, and phase shift circuit 302 is the only additional test circuitry added to the integrated circuit to test the phase offset between the output clock signals of PSGC 301. Alternatively, PSGC 301 and PLL 310 may be on different integrated circuits.

When phase shift circuit 302, multiplexer 316, PFD 311, and lock generation circuit 312 are intended to be used as test circuitry for testing the phase difference between CLK2 and CLK0, multiplexer 316 is configured to transmit clock signal CLK0D to the second input of PFD 311. PFD 311 generates pulses in its UP and DN output signals. The durations of the pulses in the UP and DN output signals of PFD 311 are determined based on the phase difference between CLK2 and CLK0D, as described above with respect to PFD 112.

Lock generation circuit 312 generates a LOCK signal. Lock generation circuit 312 sets the logic state of the LOCK signal based on the UP and DN signals generated by PFD 311. The logic state of the LOCK signal indicates if the phase difference between CLK2 and CLK0D is within the lock window of lock generation circuit 312. The lock window of circuit 312 is programmed by the lock window signal WIN. In an embodiment, lock generation circuit 312 may have the same architecture that is shown in and described above with respect to FIG. 1B.

FIGS. 4A-4D illustrate additional examples of how test circuitry can test phase differences between multiple periodic signals, according to embodiments of the present invention. In FIGS. 4A-4D periodic signal generation circuit (PSGC) 401 generates 8 periodic output clock signals CLK0, CLK1, CLK2, CLK3, CLK4, CLK5, CLK6, and CLK7 (i.e., CLK [7:0]) in response to periodic input clock signal CLKIN. Clock signals CLK0, CLK1, CLK2, CLK3, CLK4, CLK5, CLK6, and CLK7 have target phase offsets of 0°, 45°, 90°, 135°, 180°, 225°, 270°, and 315°, respectively, relative to each other. PSGC 401 may be, e.g., a PLL or a DLL.

The test circuitry of FIGS. 4A-4D includes 8-to-1 multiplexer circuits 402-403, inverter circuit 404, phase frequency detector (PFD) circuit 405, and lock generation circuit 406. Phase frequency detector circuit 405 and lock generation circuit 406 may, for example, be part of a PLL that is on the same integrated circuit as PSGC 401, as described above with respect to FIG. 3. Multiplexer circuits 402-403 may, for example, be part of PSGC 401.

The test circuitry of FIGS. 4A-4D is designed to test the phase difference between two selected output clock signals of PSGC 401 that have a target phase offset of 180°. For example, in FIG. 4A, multiplexer 403 is configured by select signal S2 to select clock signal CLK4. CLK4 is transmitted to a first input of PFD 405. Also in FIG. 4A, multiplexer 402 is configured by select signal S1 to select clock signal CLK0. CLK0 is transmitted to an input of inverter circuit 404. Inverter 404 inverts CLK0 to generate inverted clock signal CLK0B. The delay of inverter 404 is small compared to the period of CLK0. Clock signal CLK0B is transmitted to a second input of PFD 405. Inverter 404 is the phase shift circuit in the embodiments of FIGS. 4A-4D.

Clock signals CLK0 and CLK4 have a target phase offset of 180°. If CLK0 and CLK4 are offset in phase by 180°, then inverter 404 generates a clock signal CLK0B that is approximately aligned in phase with CLK4. However, CLK0 and CLK4 may have a phase offset that is greater than or less than 180°. If the phase difference between CLK0 and CLK4 is greater than or less than 180°, then the phases of CLK0B and CLK4 are not aligned. The test circuitry of FIG. 4A determines if the phase difference between CLK0B and CLK4 is within the lock window of lock generation circuit 406.

PFD 405 generates pulses in its UP and DN output signals in response to clock signals CLK4 and CLK0B. PFD 405 sets the durations of the pulses in the UP and DN output signals based on the phase difference between CLK4 and CLK0B, as described above with respect to PFD 112 in FIG. 1A.

Lock generation circuit 406 sets the logic state of its output LOCK signal based on the pulses in the UP and DN signals generated by PFD 405. The logic state of the LOCK signal indicates if the phase difference between CLK4 and CLK0B is within the lock window of lock generation circuit 406. The lock window of circuit 406 is programmed by the lock window signal WIN. The lock window of circuit 406 can, for example, be programmed to compensate for the delay of inverter 404. The lock window may be programmed so that a phase offset between the input clock signals to PFD 405 that is equal to or less than the delay of inverter 404 causes circuit 406 to generate a logic state in the LOCK signal indicating the input clock signals to PFD 405 are in phase. Lock generation circuit 406 may have the same architecture that is shown in and described above with respect to FIG. 1B.

Figure 4A:
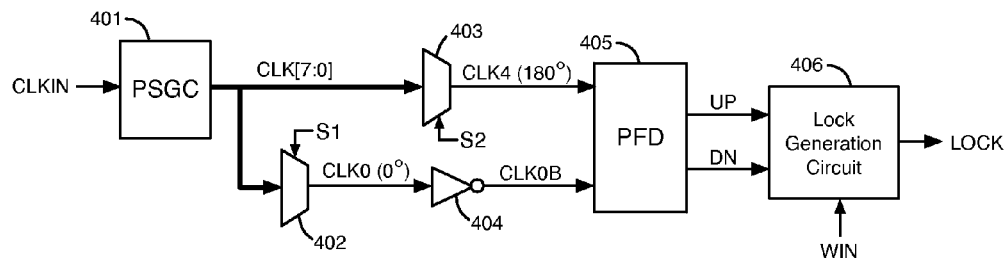
FIGS. 4A-4D illustrate additional examples of how test circuitry can test phase differences between multiple periodic signals, according to embodiments of the present invention.
Figure 4B:
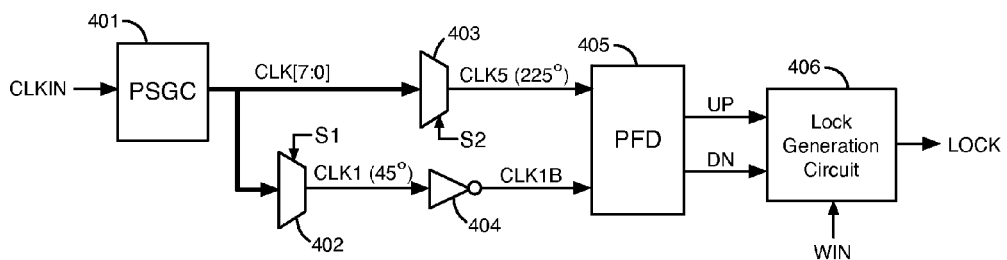

In FIG. 4B, multiplexer 403 is configured by signal S2 to select clock signal CLK5. CLK5 is transmitted to a first input of PFD 405. Also in FIG. 4B, multiplexer 402 is configured by signal S1 to select clock signal CLK1. CLK1 is transmitted to an input of inverter circuit 404. Inverter 404 inverts CLK1 to generate inverted clock signal CLK1B. Clock signal CLK1B is transmitted to a second input of PFD 405.

Clock signals CLK1 and CLK5 have a target phase offset of 180°. If CLK1 and CLK5 are offset in phase by 180°, then inverter 404 generates a clock signal CLK1B that is approximately aligned in phase with CLK5. However, CLK1 and CLK5 may have a phase offset that is greater than or less than 180°. If the phase difference between CLK1 and CLK5 is greater than or less than 180°, then the phases of CLK1B and CLK5 are not aligned. The test circuitry of FIG. 4B determines if the phase difference between CLK1B and CLK5 is within the lock window of lock generation circuit 406. The logic state of the LOCK signal generated by lock generation circuit 406 indicates if the phase difference between CLK5 and CLK1B is within the lock window of circuit 406.

Figure 4C:
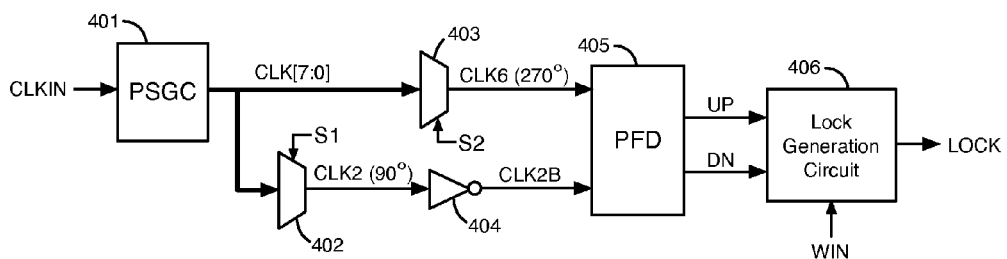

In FIG. 4C, multiplexer 403 is configured by signal S2 to select clock signal CLK6. CLK6 is transmitted to a first input of PFD 405. Also in FIG. 4C, multiplexer 402 is configured by signal S1 to select clock signal CLK2. CLK2 is transmitted to an input of inverter circuit 404. Inverter 404 inverts CLK2 to generate inverted clock signal CLK2B. Clock signal CLK2B is transmitted to a second input of PFD 405.

Clock signals CLK2 and CLK6 have a target phase offset of 180°. If CLK2 and CLK6 are offset in phase by 180°, then inverter 404 generates a clock signal CLK2B that is approximately aligned in phase with CLK6. However, CLK2 and CLK6 may have a phase offset that is greater than or less than 180°. The test circuitry of FIG. 4C determines if the phase difference between CLK2B and CLK6 is within the lock window of lock generation circuit 406. The logic state of the LOCK signal generated by lock generation circuit 406 indicates if the phase difference between CLK6 and CLK2B is within the lock window of circuit 406.

Figure 4D:
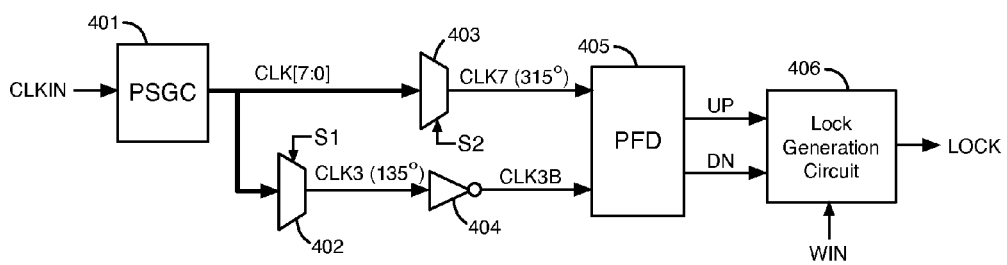

In FIG. 4D, multiplexer 403 is configured by signal S2 to select clock signal CLK7. CLK7 is transmitted to a first input of PFD 405. Also in FIG. 4D, multiplexer 402 is configured by signal S1 to select clock signal CLK3. CLK3 is transmitted to an input of inverter circuit 404. Inverter 404 inverts CLK3 to generate inverted clock signal CLK3B. Clock signal CLK3B is transmitted to a second input of PFD 405.

Clock signals CLK3 and CLK7 have a target phase offset of 180°. If CLK3 and CLK7 are offset in phase by 180°, then inverter 404 generates a clock signal CLK3B that is approximately aligned in phase with CLK7. However, CLK3 and CLK7 may have a phase offset that is greater than or less than 180°. The test circuitry of FIG. 4D determines if the phase difference between CLK3B and CLK7 is within the lock window of lock generation circuit 406. The logic state of the LOCK signal generated by lock generation circuit 406 indicates if the phase difference between CLK7 and CLK3B is within the lock window of circuit 406.

Figure 5A:
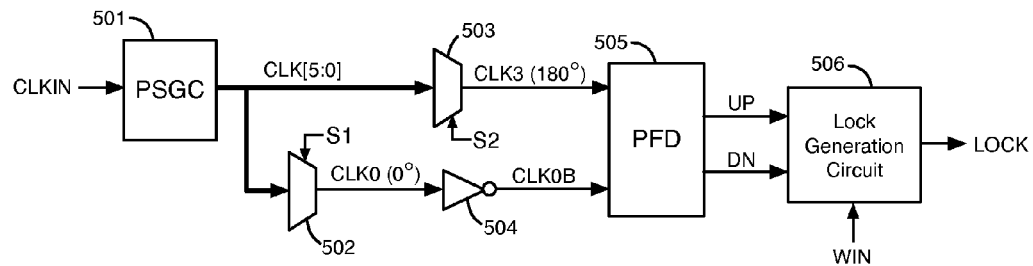
FIGS. 5A-5C illustrate more examples of how test circuitry can test the phase differences between multiple periodic signals, according to embodiments of the present invention.
Figure 5B:
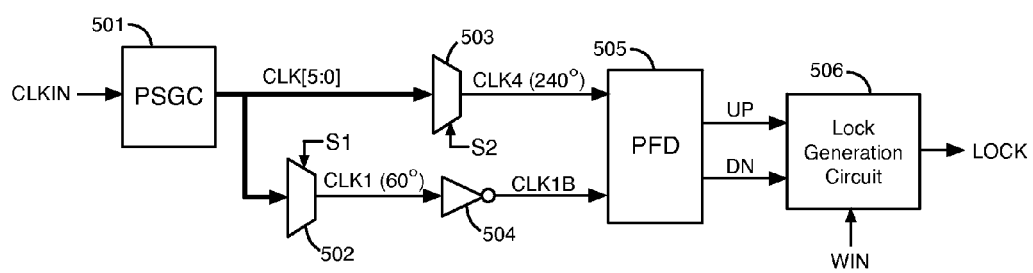
Figure 5C:
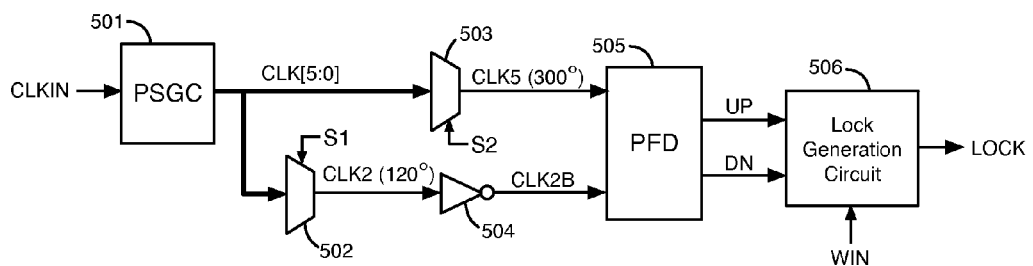

FIGS. 5A-5C illustrate more examples of how test circuitry can test the phase differences between multiple periodic signals, according to embodiments of the present invention. In FIGS. 5A-5C periodic signal generation circuit (PSGC) 501 generates 6 periodic output clock signals CLK0, CLK1, CLK2, CLK3, CLK4, and CLK5 (i.e., CLK[5:0]) in response to periodic input clock signal CLKIN. Clock signals CLK0, CLK1, CLK2, CLK3, CLK4, and CLK5 have target phase offsets of 0°, 60°, 120°, 180°, 240°, and 300°, respectively, relative to each other. PSGC 501 may be, e.g., a PLL or a DLL.

The test circuitry of FIGS. 5A-5C includes 6-to-1 multiplexer circuits 502-503, inverter circuit 504, phase frequency detector (PFD) circuit 505, and lock generation circuit 506. Phase frequency detector circuit 505 and lock generation circuit 506 may, for example, be part of a PLL that are on the same integrated circuit as PSGC 501, as described above with respect to FIG. 3. Multiplexer circuits 502-503 may, for example, be part of PSGC 501.

The test circuitry of FIGS. 5A-5C is designed to test the phase difference between two selected output clock signals of PSGC 501 that have a target phase offset of 180°. For example, in FIG. 5A, multiplexer 503 is configured by select signal S2 to select clock signal CLK3. CLK3 is transmitted to a first input of PFD 505. Also in FIG. 5A, multiplexer 502 is configured by select signal S1 to select clock signal CLK0. CLK0 is transmitted to an input of inverter circuit 504. Inverter 504 inverts CLK0 to generate inverted clock signal CLK0B. The delay of inverter 504 is small relative to the period of CLK0. CLK0B is transmitted to a second input of PFD 505.

Clock signals CLK0 and CLK3 have a target phase offset of 180°. If CLK0 and CLK3 are offset in phase by 180°, then inverter 504 generates a clock signal CLK0B that is approximately aligned in phase with CLK3. However, CLK0 and CLK3 may have a phase offset that is greater than or less than 180°. If the phase difference between CLK0 and CLK3 is greater than or less than 180°, then the phases of CLK0B and CLK3 are not aligned. The test circuitry of FIG. 5A determines if the phase difference between CLK0B and CLK3 is within the lock window of lock generation circuit 506.

PFD 505 generates pulses in its UP and DN output signals in response to clock signals CLK3 and CLK0B. PFD 505 sets the durations of the pulses in the UP and DN output signals based on the phase difference between CLK3 and CLK0B, as described above with respect to PFD 112 in FIG. 1A.

Lock generation circuit 506 sets the logic state of its output LOCK signal based on the pulses in the UP and DN signals generated by PFD 505. The logic state of the LOCK signal indicates if the phase difference between CLK3 and CLK0B is within the lock window of lock generation circuit 506. The lock window of circuit 506 is programmed by the lock window signal WIN. Lock generation circuit 506 may, e.g., have the same architecture that is shown in and described above with respect to FIG. 1B.

In FIG. 5B, multiplexer 503 is configured by select signal S2 to select clock signal CLK4. CLK4 is transmitted to a first input of PFD 505. Also in FIG. 5B, multiplexer 502 is configured by signal S1 to select clock signal CLK1. CLK1 is transmitted to an input of inverter circuit 504. Inverter 504 inverts CLK1 to generate inverted clock signal CLK1B. Clock signal CLK1B is transmitted to a second input of PFD 505.

Clock signals CLK1 and CLK4 have a target phase offset of 180°. If CLK1 and CLK4 are offset in phase by 180°, then inverter 504 generates a clock signal CLK1B that is approximately aligned in phase with CLK4. However, CLK1 and CLK4 may have a phase offset that is greater than or less than 180°. The test circuitry of FIG. 5B determines if the phase difference between CLK1B and CLK4 is within the lock window of lock generation circuit 506. The logic state of the LOCK signal generated by lock generation circuit 506 indicates if the phase difference between CLK4 and CLK1B is within the lock window of circuit 506.

In FIG. 5C, multiplexer 503 is configured by signal S2 to select clock signal CLK5. CLK5 is transmitted to a first input of PFD 505. Also in FIG. 5C, multiplexer 502 is configured by signal S1 to select clock signal CLK2. CLK2 is transmitted to an input of inverter circuit 504. Inverter 504 inverts CLK2 to generate inverted clock signal CLK2B. Clock signal CLK2B is transmitted to a second input of PFD 505.

Clock signals CLK2 and CLK5 have a target phase offset of 180°. If CLK2 and CLK5 are offset in phase by 180°, then inverter 504 generates a clock signal CLK2B that is approximately aligned in phase with CLK5. However, CLK2 and CLK5 may have a phase offset that is greater than or less than 180°. The test circuitry of FIG. 5C determines if the phase difference between CLK2B and CLK5 is within the lock window of lock generation circuit 506. The logic state of the LOCK signal generated by lock generation circuit 506 indicates if the phase difference between CLK5 and CLK2B is within the lock window of circuit 506.

Figure 6:
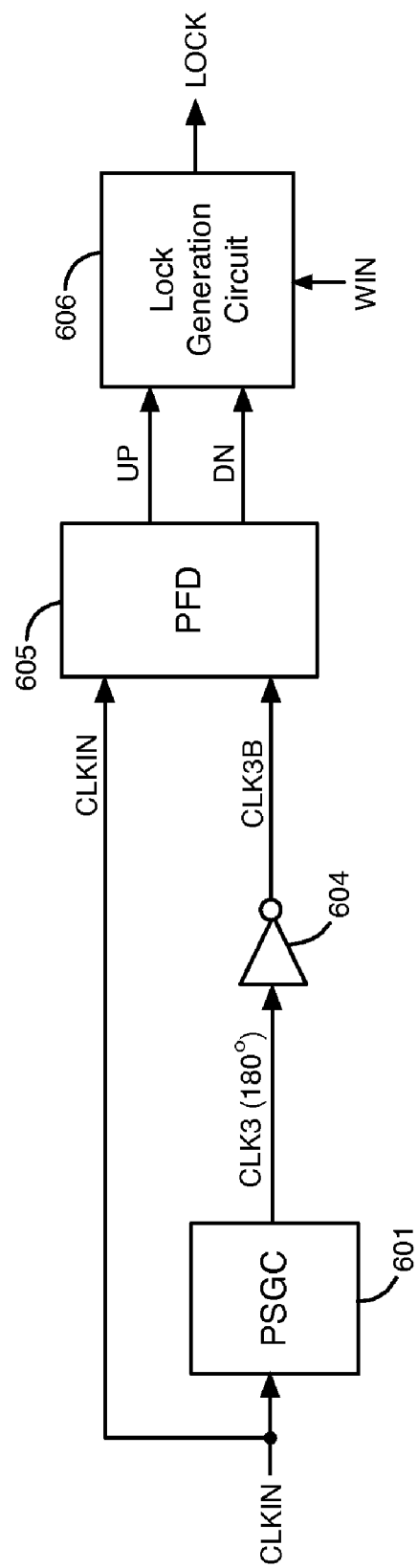
FIG. 6 illustrates an example of test circuitry that tests a phase difference between a periodic reference clock signal provided to an input of a periodic signal generation circuit (PSGC) and a periodic output clock signal generated by the PSGC circuit, according to an embodiment of the present invention.

FIG. 6 illustrates an example of test circuitry that tests a phase difference between a periodic reference clock signal provided to a periodic signal generation circuit (PSGC) 601 and a periodic output clock signal generated by circuit 601, according to an embodiment of the present invention. PSGC 601 can be, for example, a PLL or a DLL. PSGC 601 receives a periodic reference clock signal CLKIN. PSGC 601 generates periodic output clock signal CLK3 in response to reference clock signal CLKIN.

The test circuitry of FIG. 6 compares the phases of clock signals CLKIN and CLK3. Because all of the output clock signals of a PLL are generated by the same oscillator, a phase error in one of the output clock signals of the oscillator may be present in all of the output clock signals of the same oscillator. Comparing the phases of two output clock signals of an oscillator will not reveal an equal phase error in both clock signals.

The test circuitry of FIG. 6 compares the phase of the input clock signal CLKIN of PSGC 601 and the phase of an output clock signal CLK3 of PSGC 601, which are generated by different sources, to determine if the output clock signal CLK3 has a target phase offset with respect to the input clock signal CLKIN. Subsequently, the phases of the output clock signals of PSGC 601 can be compared to each other to determine if they are properly aligned in phase using one of the other embodiments described herein.

CLK3 has a target phase offset of 180° relative to CLKIN. However, CLK3 may have a phase offset that is greater than or less than 180° relative to CLKIN. The test circuitry of FIG. 6 determines if CLKIN and CLK3 are 180° apart in phase within the lock window of lock generation circuit 606.

The test circuitry of FIG. 6 includes inverter circuit 604, phase frequency detector (PFD) circuit 605, and lock generation circuit 606. Inverter circuit 604 inverts clock signal CLK3 to generate inverted clock signal CLK3B. The delay of inverter 604 is small relative to the period of CLK3. CLKIN is transmitted to a first input of PFD 605, and CLK3B is transmitted to a second input of PFD 605. PFD 605 compares the phases and frequencies of CLKIN and CLK3B to generate pulses in the UP and DN signals, as described above with respect to PFD 112.

Lock generation circuit 606 generates an output LOCK signal based on the UP and DN signals generated by PFD 605. Lock generation circuit 606 functions as described above with respect to lock generation circuit 113. Lock generation circuit 606 may, for example, have the architecture shown in FIG. 1B.

Figure 7A:
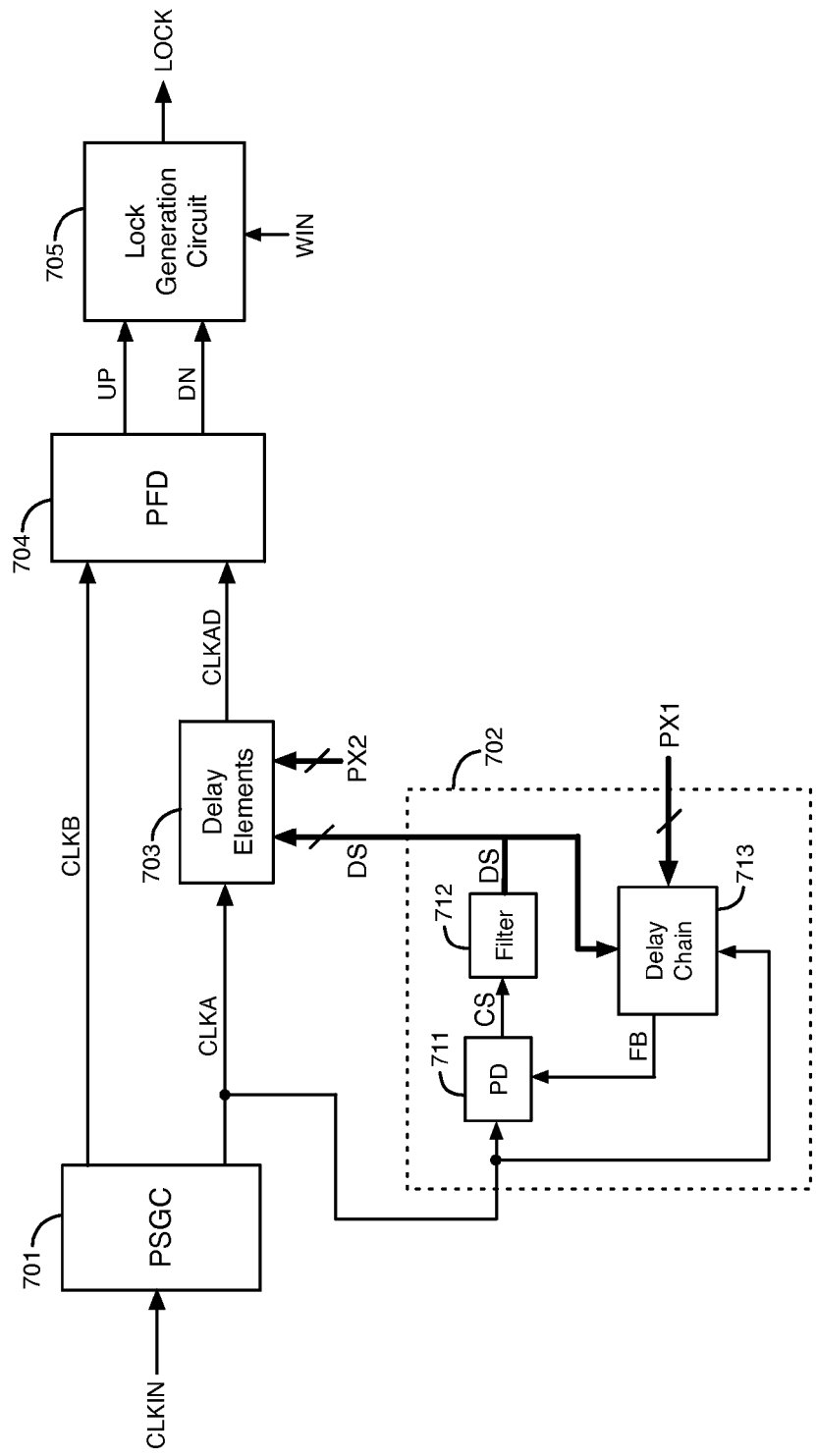
FIG. 7A illustrates another example of test circuitry that tests a phase difference between two periodic signals using a programmable delay-locked loop (DLL), according to an embodiment of the present invention.

FIG. 7A illustrates another example of test circuitry that tests a phase difference between two periodic signals using a programmable delay-locked loop (DLL), according to an embodiment of the present invention. Periodic signal generation circuit (PSGC) 701 receives a periodic reference clock signal CLKIN. PSGC 701 generates periodic output clock signals CLKA and CLKB in response to input reference clock signal CLKIN. PSGC 701 may be, e.g., a PLL or a DLL.

The test circuitry of FIG. 7A includes programmable delay-locked loop (DLL) circuit 702, delay circuit elements 703, phase frequency detector (PFD) circuit 704, and lock generation circuit 705. Delay circuit elements 703 delay clock signal CLKA to generate delayed clock signal CLKAD. The delay that delay circuit elements 703 provide to CLKAD relative to CLKA is set to equal the target phase offset between CLKA and CLKB. Thus, if the phase difference between clock signals CLKA and CLKB equals the target phase offset, then CLKAD and CLKB are aligned in phase. Clock signals CLKAD and CLKB are provided to inputs of PFD 704. PFD 704 compares the phases and frequencies of CLKAD and CLKB to generate pulses in the UP and DN signals, as described above with respect to PFD 112.

Lock generation circuit 705 generates an output LOCK signal based on the UP and DN signals generated by PFD 704. Lock generation circuit 705 functions as described above with respect to lock generation circuit 113 in FIG. 1A. Lock generation circuit 705 may, for example, have the architecture shown in FIG. 1B.

Delay circuit elements 703 include, for example, one delay circuit or multiple delay circuits that delay CLKA to generate CLKAD. The delay circuits in circuit 703 have programmable delays. The delay provided by delay circuit elements 703 to CLKAD varies based on changes in the logic states of delay setting (DS) signals and the logic states of programmable delay signals PX2.

Programmable DLL circuit 702 generates the delay setting (DS) signals. DLL circuit 702 includes phase detector (PD) circuit 711, loop filter circuit 712, and delay chain circuit 713. Delay chain circuit 713 delays clock signal CLKA to generate a feedback clock signal FB. Phase detector circuit 711 compares the phases of CLKA and FB to generate one or more control signals (CS) that vary in response to changes in the phase offset between CLKA and FB. Loop filter circuit 712 generates the delay setting (DS) signals based on the one or more control signals (CS) generated by phase detector 711. The DS signals are digital signals in the embodiment described herein. The DS signals may be analog signals in alternative embodiments.

The delay setting (DS) signals are transmitted to inputs of delay chain 713. Programmable delay PX1 signals are transmitted to additional inputs of delay chain 713 from outside DLL 702. Delay chain 713 sets the delay provided to clock signal FB relative to clock signal CLKA based on the logic states of the DS signals and based on the logic states of the PX1 programmable delay signals. Programmable delay signals PX1 and PX2 can be generated, for example, by other circuitry on the integrated circuit or provided from an external source through pins. Signals PX1 and PX2 can be programmed to any desired logic states.

DLL 702 varies the delay provided to clock signal FB in order to align the phases of clock signals FB and CLKA. When FB and CLKA are not aligned in phase, delay chain 713 varies the delay provided to FB relative to CLKA based on changes in the delay setting (DS) signals, until FB and CLKA are aligned in phase.

Figure 7B:
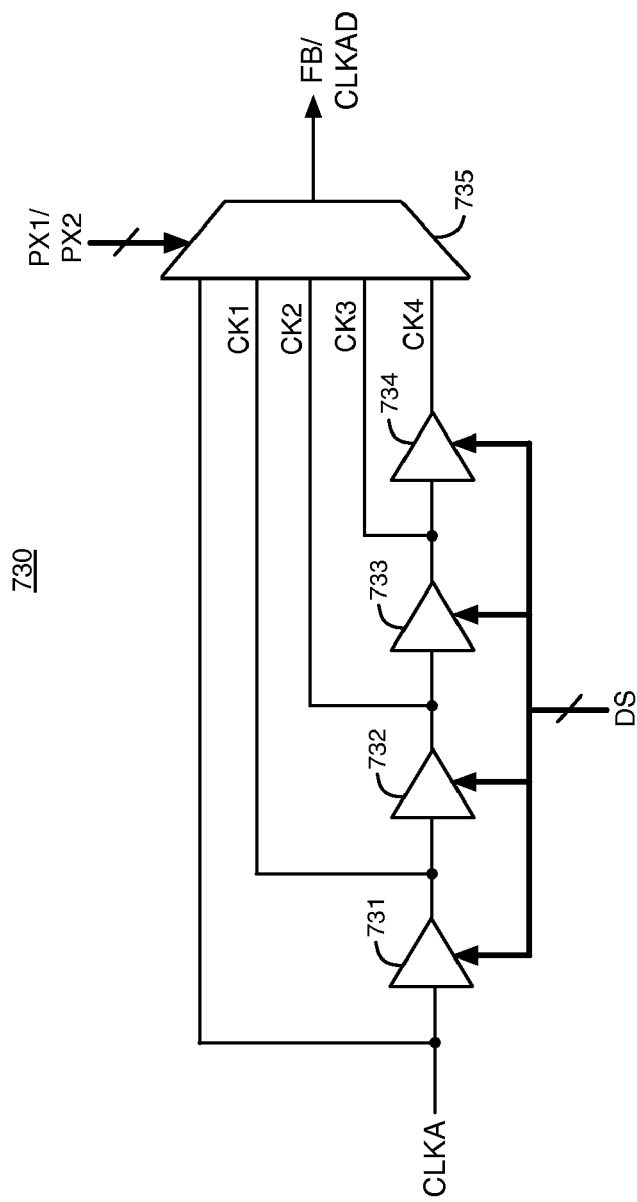
FIG. 7B illustrates an example of an adjustable delay circuit, according to an embodiment of the present invention.

FIG. 7B illustrates an example of an adjustable delay circuit 730, according to an embodiment of the present invention. In an embodiment, delay chain 713 in DLL 702 is implemented with the circuit architecture of adjustable delay circuit 730, and delay circuit elements 703 are also implemented with the circuit architecture of adjustable delay circuit 730. Adjustable delay circuit 730 includes adjustable delay circuits 731-734 and 5-to-1 multiplexer circuit 735.

Each of the adjustable delay circuits 731-734 can be, for example, a current starving inverter or current starving buffer. The delay setting signals DS control the delays of adjustable delay circuits 731-734. The delay of each of the adjustable delay circuits 731-734 varies based on changes in the DS signals. The delay setting signals DS can, for example, adjust the delays of adjustable delay circuits 731-734 by turning on or turning off transistors that provide current to a current starving inverter in each of the adjustable delay circuits.

Adjustable delay circuits 731-734 are coupled in series to form a delay chain. Adjustable delay circuit 731 delays input clock signal CLKA to generate a delayed clock signal CK1 at the input of adjustable delay circuit 732. Adjustable delay circuits 732-734 delay the delayed clock signals CK1-CK3 to generate delayed clock signals CK2-CK4, respectively. The 5 clock signals CLKA, CK1, CK2, CK3, and CK4 are provided to 5 multiplexing inputs of multiplexer circuit 735.

In delay chain 713, programmable delay signals PX1 are provided to the select inputs of multiplexer circuit 735. In delay elements 703, programmable delay signals PX2 are provided to the select inputs of multiplexer circuit 735. Multiplexer circuit 735 selects one of the clock signals CLKA and CK1-CK4 at its multiplexing inputs to generate an output clock signal FB or CLKAD at its output based on the logic states of the programmable delay signals PX1 or PX2 at its select inputs. Multiplexer 735 selects a different one of the clock signals CLKA and CK1-CK4 at its multiplexing inputs to generate the clock signal FB or CLKAD at its output based on a change in the logic states of the programmable delay signals PX1 or PX2 at its select inputs. In delay chain 713, multiplexer 735 generates feedback clock signal FB at its output. In delay elements 703, multiplexer 735 generates delayed clock signal CLKAD at its output. In addition, the delay that delay circuits 731-734 provide to the output clock signal FB or CLKAD changes in response to changes in the logic states of the DS signals.

Referring to FIG. 7A, DLL 702 varies the logic states of the delay setting (DS) signals in response to changes in the logic states of the programmable delay signals PX1 to realign the phases of clock signals CLKA and FB. The logic states of the PX2 signals can be changed to adjust the delay provided by delay circuit elements 703 to CLKAD.

Both the PX1 and PX2 signals affect the delay provided to clock signal CLKAD relative to clock signal CLKA. For example, based on the logic states of signals PX1, delay chain 713 may generate delays of A, B, C, or D in response to signals DS. In this example, based on the logic states of signals DS and PX2, delay elements 703 can generate delays of A, A/2, A/3, A/4, B, B/2, B/3, B/4, C, C/2, C/3, C/4, D, D/2, D/3, or D/4.

Using the techniques shown in and described herein with respect to FIG. 7A, the error in phase between two periodic signals can be measured. For example, the programmable delay signals PX1 or PX2 can be varied in increments until the LOCK signal generated by lock generation circuit 705 changes state. The difference between the values of the PX1 or PX2 signals during the original measurement of the LOCK signal and the values of the PX1 or PX2 signals during the measurement of the LOCK signal changing state indicates the error in phase between periodic signals CLKA and CLKB.

Figure 8:
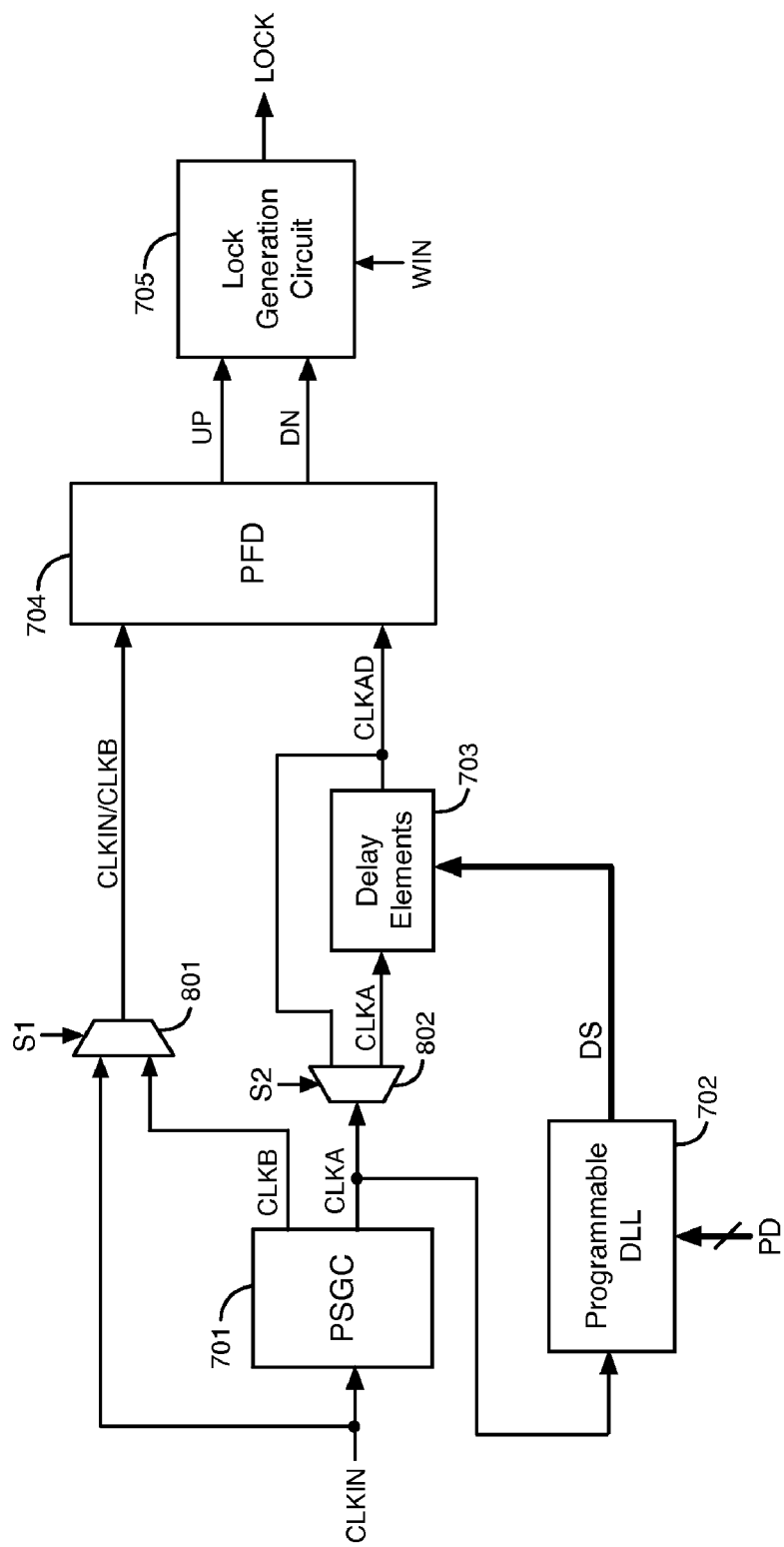
FIG. 8 illustrates another example of test circuitry that tests a phase difference between two periodic signals using a programmable DLL, according to an embodiment of the present invention.

FIG. 8 illustrates another example of test circuitry that tests a phase difference between two selected clock signals using a programmable DLL, according to an embodiment of the present invention. The embodiment of FIG. 8 includes PSGC 701, multiplexer circuit 801, demultiplexer circuit 802, programmable DLL circuit 702, delay elements 703, phase frequency detector (PFD) circuit 704, and lock generation circuit 705. The test circuitry includes circuits 702-705. Circuits 801-802 may, for example, be part of the test circuitry, part of PSGC 701, or part of programmable routing circuitry in the integrated circuit.

Multiplexer 801 can be configured to select clock signal CLKIN or clock signal CLKB for transmission to an input of PFD 704 in response to a select signal S1. PFD 704 compares the phases of the two clock signals at its inputs (CLKIN and CLKAD or CLKB and CLKAD) to generate pulses in the UP and DN signals. Lock generation circuit 705 sets the logic state of the LOCK signal based on the pulses in the UP and DN signals, as described above.

Comparing the phases of two output clock signals generated by the same circuitry does not reveal an equal phase error that is generated in both clock signals. Initially, multiplexer 801 can be configured by select signal S1 to transmit CLKIN to an input of PFD 704. The test circuitry of FIG. 8 can then compare the phase of the input clock signal CLKIN of PSGC 701 and the phase of output clock signal CLKA of PSGC 701, which are generated by different sources, to determine if CLKA contains a phase error relative to a target phase offset with CLKIN.

Subsequently, multiplexer 801 can be reconfigured by select signal S1 to transmit CLKB to an input of PFD 704. Then, the phases of the output clock signals CLKA and CLKB of PSGC 701 can be compared to each other to determine if they have a desired target phase offset using the test circuitry of FIG. 8. The delay of delay circuit elements 703 can be reprogrammed to equal a target phase offset for the two clock signals tested in each test by changing the logic states of the programmable delay signals PX1 and PX2, as described above with respect to FIG. 7A.

Demultiplexer 802 can be configured by select signal S2 to transmit clock signal CLKA to an input of delay circuit elements 703. Delay circuit elements 703 delay CLKA to generate clock signal CLKAD as described above with respect to FIG. 7A.

Alternatively, demultiplexer 802 can be configured by select signal S2 to transmit clock signal CLKA directly to an input of PFD 704 as clock signal CLKAD bypassing delay circuit elements 703 so that clock signals CLKA and CLKAD have the same or nearly the same phase. Delay circuit elements 703 can be turned off. PFD 704 compares the phases of CLKIN (or CLKB) and CLKAD. In this example, CLKIN (or CLKB) and CLKAD have a 0° target phase offset.

Figure 9:
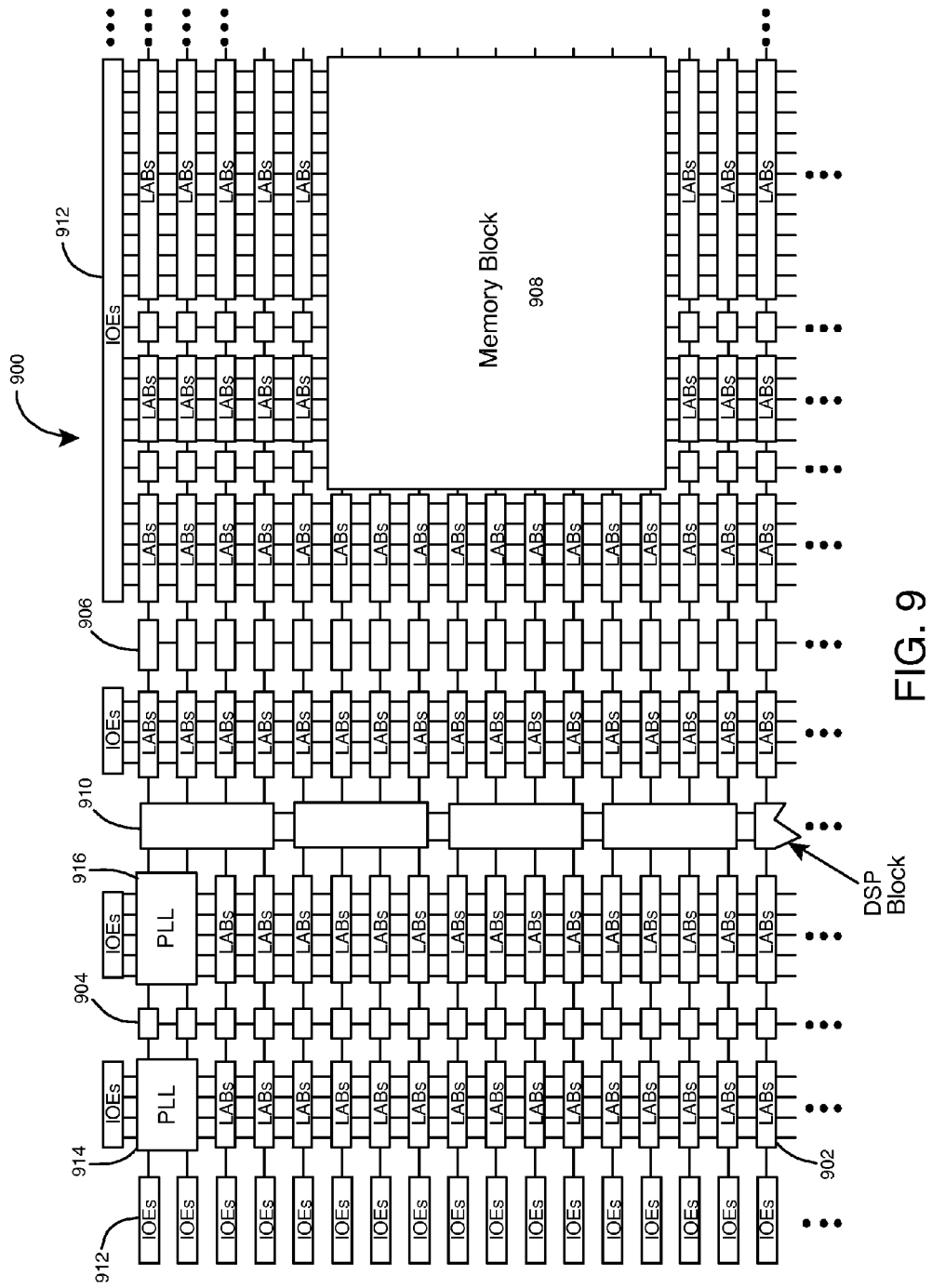
FIG. 9 is a simplified partial block diagram of a field programmable gate array (FPGA) that can include aspects of the present invention.

FIG. 9 is a simplified partial block diagram of a field programmable gate array (FPGA) 900 that can include aspects of the present invention. FPGA 900 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 900 includes a two-dimensional array of programmable logic array blocks (or LABs) 902 that are interconnected by a network of column and row interconnect conductors of varying length and speed. LABs 902 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 900 also includes a distributed memory structure including random access memory (RAM) blocks of varying sizes provided throughout the array. The RAM blocks include, for example, blocks 904, blocks 906, and block 908. These memory blocks can also include shift registers and first-in-first-out (FIFO) buffers.

FPGA 900 also includes digital signal processing (DSP) blocks 910 that can implement, for example, multipliers with add or subtract features. FPGA 900 further includes phase-locked loops (PLLs) 914 and 916. Input/output elements (IOEs) 912 located, in this example, around the periphery of the chip, support numerous single-ended and differential input/output standards. Some of the IOEs 912 are coupled to PLLs 914 and 916. IOEs 912 include input and output buffers that are coupled to pins of the integrated circuit. The pins are external terminals of the FPGA die that can be used to route, for example, input signals, output signals, and supply voltages between the FPGA and one or more external devices. It should be understood that FPGA 900 is described herein for illustrative purposes only and that the present invention can be implemented in many different types of integrated circuits.

Figure 10:
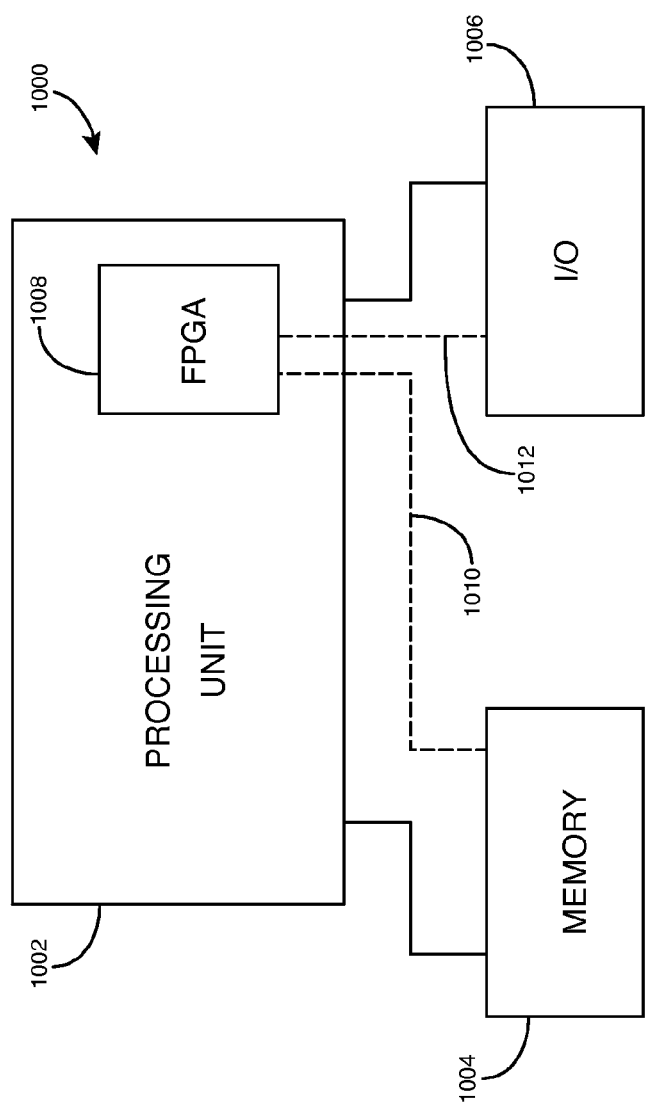
FIG. 10 shows a block diagram of an exemplary digital system that can embody techniques of the present invention.

The present invention can also be implemented in a system that has an FPGA as one of several components. FIG. 10 shows a block diagram of an exemplary digital system 1000 that can embody techniques of the present invention. System 1000 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1000 can be provided on a single board, on multiple boards, or within multiple enclosures.

System 1000 includes a processing unit 1002, a memory unit 1004, and an input/output (I/O) unit 1006 interconnected together by one or more buses. According to this exemplary embodiment, an FPGA 1008 is embedded in processing unit 1002. FPGA 1008 can serve many different purposes within the system of FIG. 10. FPGA 1008 can, for example, be a logical building block of processing unit 1002, supporting its internal and external operations. FPGA 1008 is programmed to implement the logical functions necessary to carry on its particular role in system operation. FPGA 1008 can be specially coupled to memory 1004 through connection 1010 and to I/O unit 1006 through connection 1012.

Processing unit 1002 can direct data to an appropriate system component for processing or storage, execute a program stored in memory 1004, receive and transmit data via I/O unit 1006, or other similar functions. Processing unit 1002 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1008 can control the logical operations of the system. As another example, FPGA 1008 acts as a reconfigurable processor that can be reprogrammed as needed to handle a particular computing task. Alternatively, FPGA 1008 can itself include an embedded microprocessor. Memory unit 1004 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
a phase detector circuit that generates a phase comparison signal based on a phase difference between first and second periodic signals during a test mode, wherein phases of the first and the second periodic signals do not change in response to variations in a signal generated by the phase detector circuit during the test mode; and
a lock generation circuit that generates an output signal based on the phase comparison signal that indicates if the first and the second periodic signals are within a lock window of the lock generation circuit, wherein the lock window of the lock generation circuit changes in response to a variation in a control signal.

2. The circuit of claim 1 further comprising:
a phase shift circuit that generates the second periodic signal by phase shifting a third periodic signal.

3. The circuit of claim 2 wherein the phase shift circuit is an inverter circuit.

4. The circuit of claim 1 wherein the lock generation circuit comprises a comparator circuit and a multiplexer circuit that selects a reference voltage for transmission to the comparator circuit in response to the control signal.

5. The circuit of claim 2 further comprising:
a delay-locked loop circuit that generates a phase shift signal in response to the third periodic signal, wherein the phase shift circuit has an adjustable phase shift that varies based on a change in the phase shift signal generated by the delay-locked loop circuit.

6. The circuit of claim 5 wherein the delay-locked loop circuit comprises a delay chain, wherein the phase shift signal and a programmable delay signal control the delay of the delay chain, wherein the phase shift signal varies in response to changes in a phase of the third periodic signal, and the programmable delay signal is generated outside the delay-locked loop circuit.

7. The circuit of claim 1 further comprising:
a periodic signal generation circuit that generates the second periodic signal in response to the first periodic signal.

8. The circuit of claim 1 further comprising:
a periodic signal generation circuit that generates third and fourth periodic signals;
a first multiplexer circuit that receives the third and the fourth periodic signals at inputs and that generates the first periodic signal at an output;
a second multiplexer circuit that receives the third and the fourth periodic signals at inputs and that generates a fifth periodic signal at an output; and
a phase shift circuit that generates the second periodic signal by phase shifting the fifth periodic signal.

9. A circuit comprising:
a delay-locked loop circuit that generates a delay control signal;
a delay circuit that delays a first periodic signal to generate a second periodic signal, wherein a delay that the delay circuit provides to the first periodic signal is based on the delay control signal;
a first phase detector circuit that generates a phase comparison signal based on a phase difference between the second periodic signal and a third periodic signal; and
a lock generation circuit that generates an output signal based on the phase comparison signal that indicates if the second and the third periodic signals are within a margin of error determined by the lock generation circuit.

10. The circuit of claim 9 wherein the delay-locked loop circuit generates the delay control signal in response to the first periodic signal.

11. The circuit of claim 9 wherein the delay-locked loop circuit comprises a second phase detector circuit and a delay chain, wherein the delay control signal and an input signal control the delay of the delay chain, wherein the delay control signal varies based on changes in an output signal of the second phase detector circuit, and the input signal is provided from outside the delay-locked loop circuit.

12. The circuit of claim 9 further comprising:
a demultiplexer circuit having an input that receives a fourth periodic signal, a first output coupled to an input of the delay circuit, and a second output coupled to an input of the first phase detector circuit.

13. The circuit of claim 9 further comprising:
a periodic signal generation circuit that generates a fourth periodic signal in response to a fifth periodic signal; and
a multiplexer circuit having inputs that receive the fourth and the fifth periodic signals and an output that generates the third periodic signal.

14. The circuit of claim 13 wherein the periodic signal generation circuit generates the first periodic signal in response to the fifth periodic signal.

15. The circuit of claim 9 wherein the first phase detector circuit and the lock generation circuit are part of a phase-locked loop circuit.

16. The circuit of claim 15 wherein phases of the second and the third periodic signals do not change in response to variations in a signal generated by the first phase detector circuit during a test mode.

17. The circuit of claim 9 wherein the circuit is in a field programmable gate array integrated circuit.

18. A method for testing a phase difference between periodic signals, the method comprising:
- generating a delay control signal using a delay-locked loop circuit comprising a first phase detector;
- delaying a first periodic signal to generate a second periodic signal by a delay that changes based on a variation in the delay control signal;
- generating a phase comparison signal based on a phase difference between the second periodic signal and a third periodic signal using a second phase detector; and
- generating an output signal based on the phase comparison signal that indicates if phases of the second and the third periodic signals are within a margin of error.

19. The method of claim 18 wherein generating a delay control signal using a delay-locked loop circuit comprising a first phase detector further comprises generating the delay control signal in response to the first periodic signal using the delay-locked loop circuit, and varying the delay control signal in response to an input signal generated outside the delay-locked loop circuit.

20. The method of claim 18 further comprising:
- generating a fourth periodic signal in response to a fifth periodic signal; and
- selecting one of the fourth and the fifth periodic signals to generate the third periodic signal.

21. The method of claim 18 further comprising:
- generating the first periodic signal using a phase-locked loop circuit in response to the third periodic signal that is provided to an input of the phase-locked loop circuit.

\* \* \* \* \*